United States Patent
Hessenius et al.

(10) Patent No.: US 12,422,505 B1
(45) Date of Patent: Sep. 23, 2025

(54) STABILIZATION OF LASER-BASED SENSORS

(71) Applicant: DeUVe Photonics, Inc., Sahuarita, AZ (US)

(72) Inventors: Chris Hessenius, Sahuarita, AZ (US); Mahmoud Fallahi, Sahuarita, AZ (US)

(73) Assignee: DEUVE PHOTONICS, INC., Sahuarita, AZ (US)

( * ) Notice: Subject to any disclaimer, the term of this patent is extended or adjusted under 35 U.S.C. 154(b) by 267 days.

(21) Appl. No.: 18/347,438

(22) Filed: Jul. 5, 2023

Related U.S. Application Data

(60) Provisional application No. 63/358,441, filed on Jul. 5, 2022.

(51) Int. Cl.
G01R 33/032 (2006.01)

(52) U.S. Cl.
CPC .................. *G01R 33/032* (2013.01)

(58) Field of Classification Search
CPC ..................................... G01R 33/032
USPC ..................................... 324/244.1
See application file for complete search history.

(56) References Cited

U.S. PATENT DOCUMENTS

| | | | |
|---|---|---|---|
| 5,119,024 A | 6/1992 | Popovic et al. | |
| 7,723,985 B2 | 5/2010 | Smith | |
| 8,422,119 B1 | 4/2013 | Keaton et al. | |
| 9,551,763 B1 * | 1/2017 | Hahn | G01R 33/032 |
| 9,568,565 B2 | 2/2017 | Parsa et al. | |
| 9,684,041 B2 | 6/2017 | Nagasak et al. | |
| 10,018,686 B1 * | 7/2018 | Bickford | G01R 33/035 |
| 10,060,993 B2 * | 8/2018 | Larsen | G01R 33/24 |
| 2004/0252734 A1 | 12/2004 | Karpushko | |
| 2008/0019406 A1 | 1/2008 | Abram et al. | |
| 2009/0296752 A1 | 12/2009 | Giaretta et al. | |

(Continued)

FOREIGN PATENT DOCUMENTS

| | | | | |
|---|---|---|---|---|
| WO | 2004064211 A1 | 7/2004 | | |
| WO | WO-2020106957 A1 * | 5/2020 | ........... | G01R 33/032 |

OTHER PUBLICATIONS

WIPO, "International Search Report and Written Opinion" issued in connection with WIPO Patent Application PCT/US2024/036793, dated Nov. 15, 2024, 11 pages.

(Continued)

*Primary Examiner* — Christopher P McAndrew
(74) *Attorney, Agent, or Firm* — NGUYEN TARBET IP LAW

(57) ABSTRACT

A magnetometer system structured to measure a magnetic field. The device may comprise a housing with shock absorbers disposed within and a laser cavity network disposed within the housing. The laser cavity network may comprise one or more laser cavity arms, each having a gain chip configured to generate a laser beam and a means for locking a wavelength of the laser beam. The laser cavity network may further comprise a nitrogen-vacancy (NV) diamond disposed within the laser cavity network, configured to accept the one or more laser beams of the one or more laser cavity arms and measure the magnetic field in response to the plurality of laser beams. The system may further comprise a power and control subsystem communicatively connected to the laser cavity network such that the power and control subsystem is external to the housing.

20 Claims, 3 Drawing Sheets

(56) References Cited

U.S. PATENT DOCUMENTS

| | | | |
|---|---|---|---|
| 2011/0175604 A1 | 7/2011 | Polzer et al. | |
| 2013/0021602 A1 | 1/2013 | Dribinski et al. | |
| 2015/0071316 A1 | 3/2015 | Chuang | |
| 2015/0311673 A1 | 10/2015 | Wang et al. | |
| 2017/0212177 A1 | 7/2017 | Coar et al. | |
| 2017/0212180 A1 | 7/2017 | Hahn et al. | |
| 2017/0212186 A1 | 7/2017 | Hahn et al. | |
| 2018/0337516 A1 | 11/2018 | Tatum et al. | |
| 2019/0018076 A1* | 1/2019 | Hahn | G01N 21/64 |
| 2019/0312408 A1 | 10/2019 | Fallahi et al. | |
| 2020/0209328 A1* | 7/2020 | Alford | G01R 33/26 |

OTHER PUBLICATIONS

Shin, David. Nonlocal correlations between freely propagating pairs of atoms. Diss. The Australian National University (Australia), 2022.

Steinert et al. "High sensitivity magnetic imaging using an array of spins in diamond." Review of scientific instruments 81.4 (2010).

Hannegan II, John Michael. Experiments with Frequency Converted Photons from a Trapped Atomic Ion. Diss. University of Maryland, College Park, 2022.

\* cited by examiner

STABILIZATION OF LASER-BASED SENSORS

CROSS-REFERENCES TO RELATED APPLICATIONS

This application is a non-provisional and claims benefit of U.S. Provisional Application No. 63/358,441 filed Jul. 5, 2022, the specification of which is incorporated herein in its entirety by reference.

FIELD OF THE INVENTION

The present invention is directed to a magnetometer system capable of reducing noise from laser source fluctuation, mechanical vibrations, and electrical interference.

BACKGROUND OF THE INVENTION

A magnetometer is a device used to measure the magnetic field, particularly with respect to its magnetic strength and orientation. Magnetometers, due to the many ways that magnetic fields appear in the world, are used for a variety of purposes. These include locating objects giving off a magnetic field or that are susceptible to magnetism, especially in hazardous locations, heart monitoring, positioning for drills and military weapons systems, weather prediction, plate tectonics, radio wave propagation, and planetary exploration. Additionally, magnetometers can be used for air transportation navigation, such as in spacecraft, airplanes, helicopters, etc.

To develop a highly sensitive laser-based quantum magnetometer, noise sources must be mitigated to maximize the device's potential. Thus, there exists a present need for a laser system comprising multiple mechanisms for stabilization and noise reduction.

BRIEF SUMMARY OF THE INVENTION

It is an objective of the present invention to provide systems that allow for a magnetometer system capable of reducing noise from laser source fluctuation, mechanical vibrations, and electrical interference, as specified in the independent claims. Embodiments of the invention are given in the dependent claims. Embodiments of the present invention can be freely combined with each other if they are not mutually exclusive.

The present invention features a magnetometer system structured to measure a magnetic field. In some embodiments, the system may comprise a housing comprising an interior wall and one or more shock absorbers disposed along the interior wall, and a laser cavity network disposed within the housing such that the laser cavity network is suspended in place by the one or more shock absorbers. In some embodiments, the laser cavity network may comprise one or more laser cavity arms. In some embodiments, each cavity arm may comprise a gain chip configured to generate a laser beam, and a means for locking a wavelength of the laser beam, configured to tune the laser beam and maintain a single frequency operation for the laser beam. The laser cavity network may further comprise a nitrogen-vacancy (NV) diamond disposed within the laser cavity network, configured to accept the one or more laser beams of the one or more laser cavity arms and measure the magnetic field in response to the plurality of laser beams. Measuring the magnetic field may comprise optically measuring an electron spin state of a center of the NV diamond. In some embodiments, the system may further comprise a power and control subsystem communicatively connected to the laser cavity network such that the power and control subsystem is external to the housing. The power and control subsystem may comprise a power supply configured to power the laser cavity network and control electronics to control a function of the laser cavity network.

For the nitrogen-vacancy (NV) diamond quantum magnetometer, several sources of noise are identified and solutions to minimizing their effect on device performance are described here. It is anticipated these techniques will work for many laser-based sensors. In order to maximize laser performance, the three main sources of noise must be mitigated simultaneously. They are laser output fluctuations, mechanical vibrations, and electronic interference.

One of the unique and inventive technical features of the present invention is the implementation of a wavelength-locking mechanism implemented in a laser cavity of a magnetometer. Without wishing to limit the invention to any theory or mechanism, it is believed that the technical feature of the present invention advantageously provides for accurate quantum magnetometer output and the prevention of "hopping" between laser modes during use. None of the presently known prior references or work has the unique inventive technical feature of the present invention.

Any feature or combination of features described herein are included within the scope of the present invention provided that the features included in any such combination are not mutually inconsistent as will be apparent from the context, this specification, and the knowledge of one of ordinary skills in the art. Additional advantages and aspects of the present invention are apparent in the following detailed description and claims.

BRIEF DESCRIPTION OF THE SEVERAL VIEWS OF THE DRAWING(S)

The features and advantages of the present invention will become apparent from a consideration of the following detailed description presented in connection with the accompanying drawings in which.

DETAILED DESCRIPTION OF THE INVENTION

The term "etalon" is defined herein as an optical device containing parallel mirrors, used as a narrow band filter, often in laser design.

The term "birefringent" is defined herein as the double refraction of light in a transparent, molecularly ordered material, which is manifested by the existence of orientation-dependent differences in refractive index.

Figure 1:
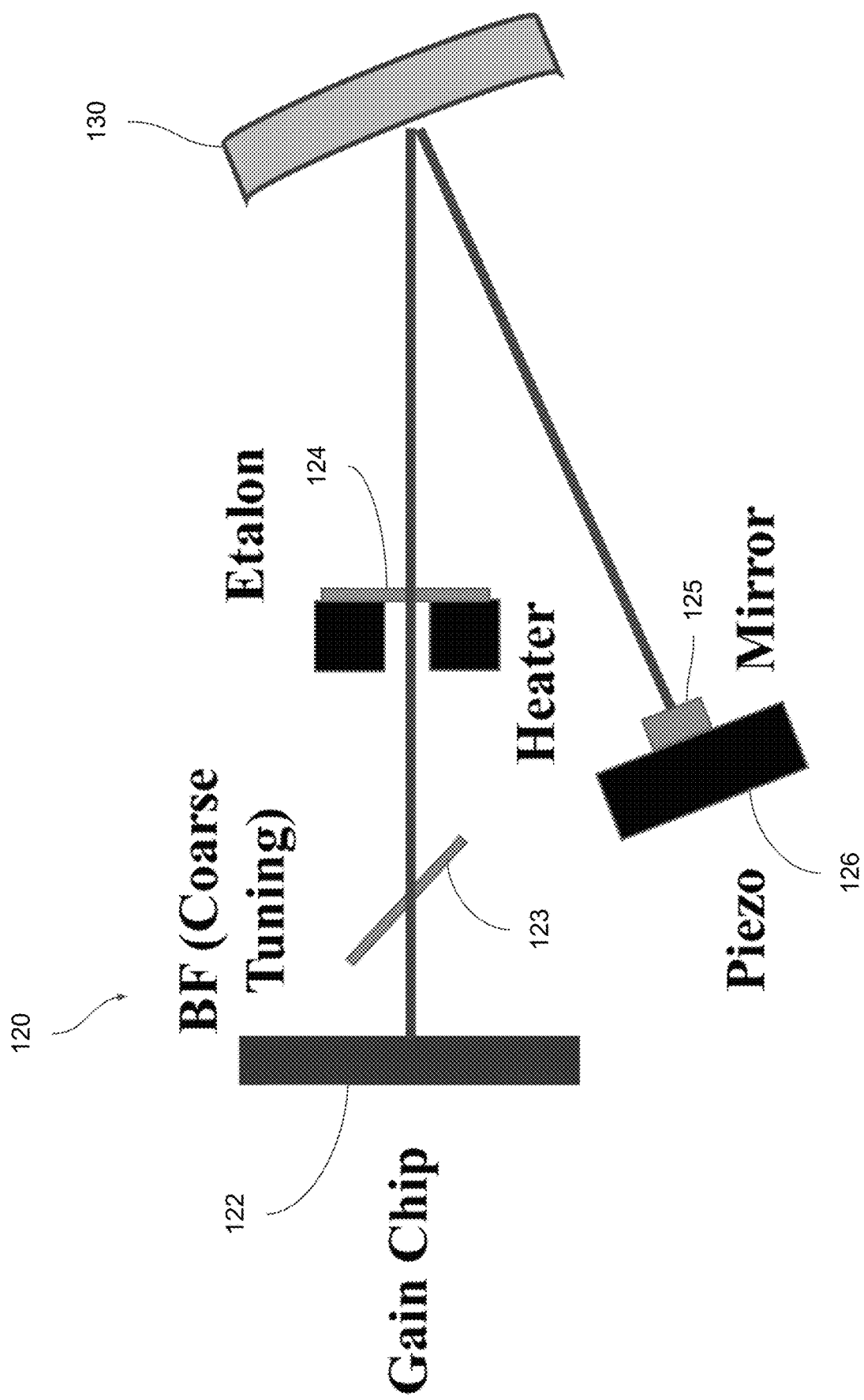
FIG. 1 shows a design for a VECSEL with integrated tuning and laser line stabilization.
Figure 2:
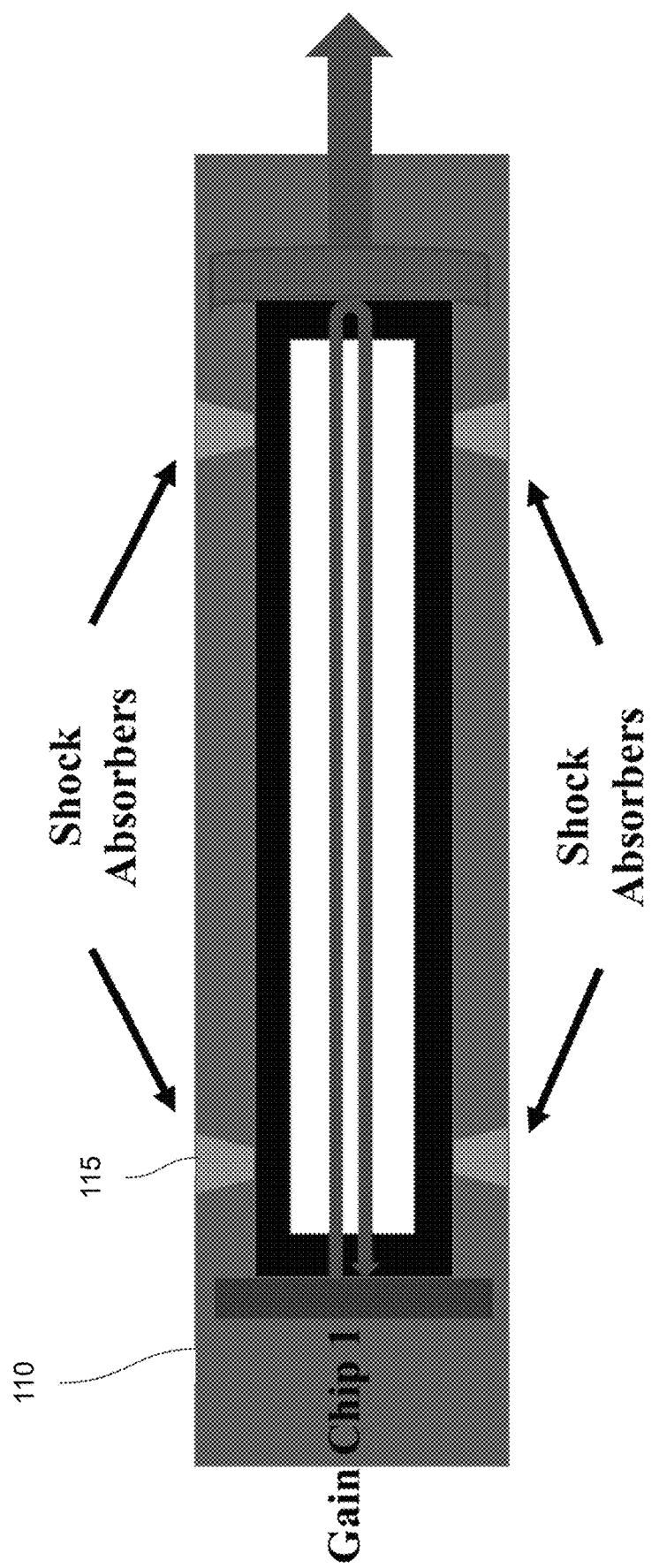
FIG. 2 shows a method for mitigation of mechanical vibration of the sensor "head."
Figure 3:
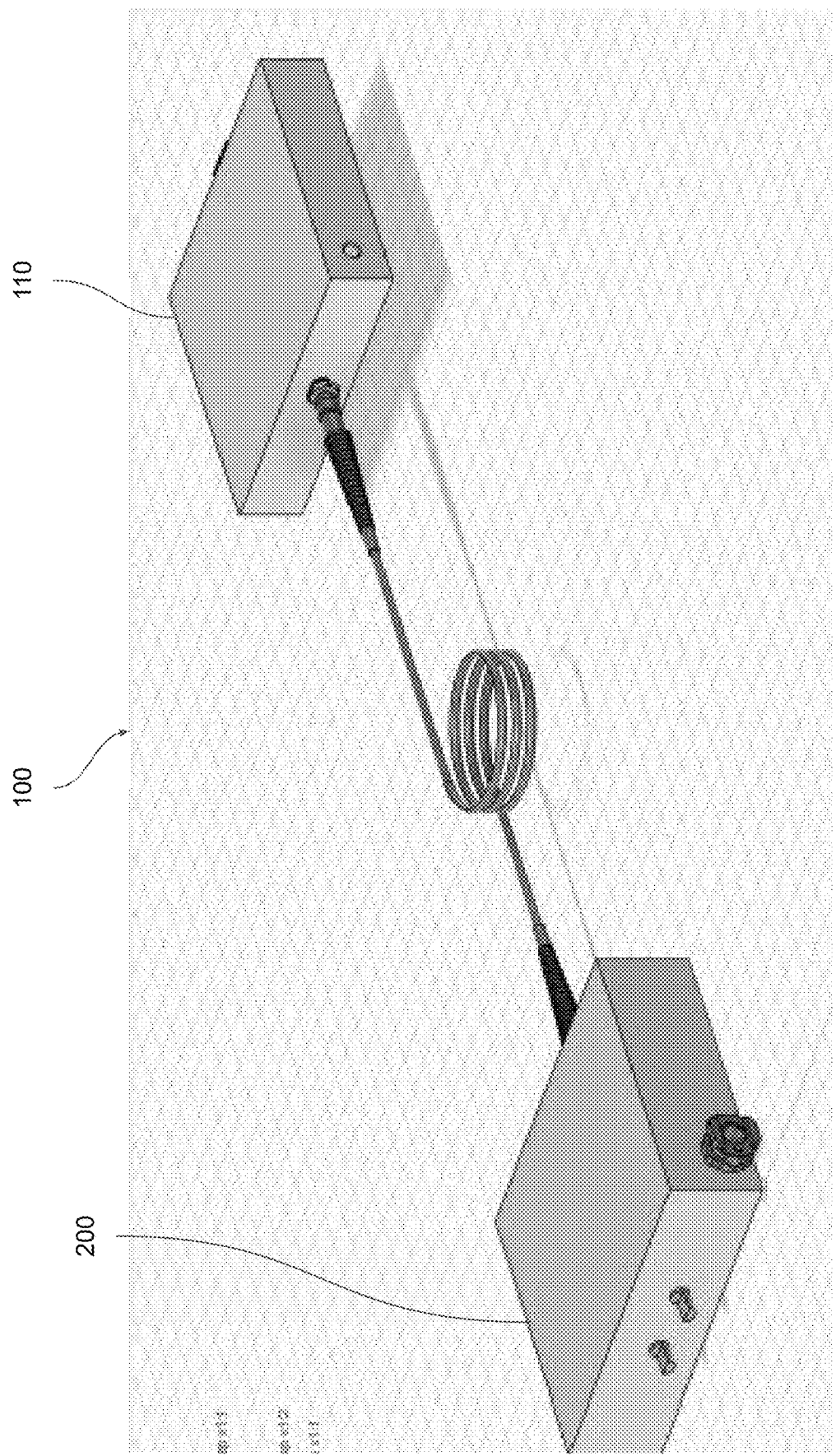
FIG. 3 shows a design for the mitigation of electrical interference in a VECSEL system with the "head" of the device separated from the power and control components.

Referring now to FIGS. 1-3, the present invention features a magnetometer system (100) structured to measure a magnetic field. In some embodiments, the system (100) may comprise a housing (110) comprising an interior wall and one or more shock absorbers (115) disposed along the interior wall, and a laser cavity network (120) disposed within the housing (110) such that the laser cavity network (120) is suspended in place by the one or more shock absorbers (115). In some embodiments, the laser cavity network (120) may comprise one or more laser cavity arms. In some embodiments, each cavity arm may comprise a gain chip (122) configured to generate a laser beam, and a means for locking a wavelength of the laser beam, configured to tune the laser beam and maintain a single frequency operation for the laser beam. The laser cavity network (120) may further comprise a nitrogen-vacancy (NV) diamond (130) disposed within the laser cavity network (120), configured to accept the one or more laser beams of the one or more laser cavity arms and measure the magnetic field in response to the plurality of laser beams. Measuring the magnetic field may comprise optically measuring an electron spin state of a center of the NV diamond (130). In some embodiments, the system (100) may further comprise a solid state electron detector configured to measure the electron spin state of the center of the NV diamond (130).

In some embodiments, the system (100) may further comprise a power and control subsystem (200) communicatively connected to the laser cavity network (120) such that the power and control subsystem (200) is external to the housing (110). The power and control subsystem (200) may comprise a power supply configured to power the laser cavity network (120) and control electronics to control a function of the laser cavity network (120). In some embodiments, the "head" and the power and control subsystem may be connected by a wired connection (e.g. a cable) or a wireless connection through the use of an antenna capable of wireless communication (i.e. a radiofrequency transceiver, a Bluetooth chip, etc.).

In some embodiments, the one or more shock absorbers (115) may comprise springs, foam, rubber, or a combination thereof. In some embodiments, the housing (110) may comprise a plastic, rubber, metallic, or any other rigid material. The one or more shock absorbers (115) may be fabricated into the housing (110) or attached to the interior of the housing by an adhesive, a connecting component, or a combination thereof. In some embodiments, the housing (110) may be sized to hold a plurality of laser cavity networks (e.g., 1 to 5 laser cavity networks). In some embodiments, each laser cavity network may comprise 1 to 10 cavity arms.

In some embodiments, for each laser cavity arm of the one or more laser cavity arms, the means for locking the wavelength of the laser beam may comprise a rough tuning filter (123) operatively coupled to the gain chip (122), configured to coarsely tune the laser beam generated by the gain chip (122). In some embodiments, the rough tuning filter (123) may comprise a birefringent filter.

In some embodiments, for each laser cavity arm of the one or more laser cavity arms, the means for locking the wavelength of the laser beam may further comprise a temperature-controlled etalon (124) disposed optically in line with the gain chip (122), configured to fine-tune and narrow a linewidth of the laser beam. In some embodiments, the temperature-controlled etalon (124) may comprise a thermoelectric cooler or a heater.

In some embodiments, each laser cavity arm of the one or more laser cavity arms may further comprise a mirror component (125) disposed optically in line with the gain chip (122). In some embodiments, for each laser cavity arm of the one or more laser cavity arms, the means for locking the wavelength of the laser beam may further comprise a laser line stabilization component (126) operatively coupled to the mirror component (125), configured to adjust a position of the mirror component (125) to lock the wavelength of the laser beam to a desired wavelength. In some embodiments, the mirror may define a length of the corresponding laser cavity arm. In some embodiments, each laser cavity arm of the one or more laser cavity arms may comprise a vertical external surface-emitting laser (VECSEL).

In some embodiments, other properties of the laser beam may be locked in place by other corresponding components, such as the frequency, direction, amplitude, time period, or a combination thereof.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. In some embodiments, the figures presented in this patent application are drawn to scale, including the angles, ratios of dimensions, etc. In some embodiments, the figures are representative only, and the claims are not limited by the dimensions of the figures. In some embodiments, descriptions of the inventions described herein using the phrase "comprising" includes embodiments that could be described as "consisting essentially of" or "consisting of," and as such, the written description requirement for claiming one or more embodiments of the present invention using the phrase "consisting essentially of" or "consisting of" is met.

The reference numbers recited in the below claims are solely for ease of examination of this patent application, are exemplary, and are not intended in any way to limit the scope of the claims to the particular features having the corresponding reference numbers in the drawings.

What is claimed is:

1. A magnetometer system (100) structured to measure a magnetic field, the system (100) comprising:
   a. a housing (110) comprising an interior wall and one or more shock absorbers (115) disposed along the interior wall; and
   b. a laser cavity network (120) disposed within the housing (110) such that the laser cavity network (120) is suspended in place by the one or more shock absorbers (115), the laser cavity network (120) comprising:
      i. one or more laser cavity arms, each cavity arm comprising:
         A. a gain chip (122) configured to generate a laser beam; and
         B. a means for locking a wavelength of the laser beam, configured to tune the laser beam and maintain a single frequency operation for the laser beam; and
      ii. a nitrogen-vacancy (NV) diamond (130) disposed within the laser cavity network (120), configured to accept the one or more laser beams of the one or more laser cavity arms and measure the magnetic field in response to the plurality of laser beams;
         wherein measuring the magnetic field comprises optically measuring an electron spin state of a center of the NV diamond (130).

2. The system (100) of claim 1 further comprising a power and control subsystem (200) communicatively connected to the laser cavity network (120) such that the power and control subsystem (200) is external to the housing (110).

3. The system (100) of claim 2, wherein the power and control subsystem (200) comprises a power supply configured to power the laser cavity network (120) and control electronics to control a function of the laser cavity network (120).

4. The system (100) of claim 1, wherein the one or more shock absorbers (115) comprise springs, foam, rubber, or a combination thereof.

5. The system (100) of claim 1, wherein, for each laser cavity arm of the one or more laser cavity arms, the means for locking the wavelength of the laser beam comprises a rough tuning filter (123) operatively coupled to the gain chip (122), configured to coarsely tune the laser beam generated by the gain chip (122).

6. The system (100) of claim 5, wherein the rough tuning filter (123) comprises a birefringent filter.

7. The system (100) of claim 1, wherein, for each laser cavity arm of the one or more laser cavity arms, the means for locking the wavelength of the laser beam comprises a temperature-controlled etalon (124) disposed optically in line with the gain chip (122), configured to fine-tune and narrow a linewidth of the laser beam.

8. The system (100) of claim 7, wherein the temperature-controlled etalon (124) comprises a thermoelectric cooler.

9. The system (100) of claim 1, wherein each laser cavity arm of the one or more laser cavity arms further comprises a mirror component (125) disposed optically in line with the gain chip (122).

10. The system (100) of claim 9, wherein, for each laser cavity arm of the one or more laser cavity arms, the means for locking the wavelength of the laser beam comprises a laser line stabilization component (126) operatively coupled to the mirror component (125), configured to adjust a position of the mirror component (125) to lock the wavelength of the laser beam to a desired wavelength.

11. The system (100) of claim 1, wherein each laser cavity arm of the one or more laser cavity arms comprises a vertical external surface-emitting laser (VECSEL).

12. A magnetometer system (100) structured to measure a magnetic field, the device (100) comprising:
  a. a housing (110) comprising an interior wall and one or more shock absorbers (115) disposed along the interior wall;
  b. a laser cavity network (120) disposed within the housing (110) such that the laser cavity network (120) is suspended in place by the one or more shock absorbers (115), the laser cavity network (120) comprising:
    i. one or more laser cavity arms, each cavity arm comprising:
      A. a gain chip (122) configured to generate a laser beam, and
      B. a means for locking a wavelength of the laser beam, configured to tune the laser beam and maintain a single frequency operation for the laser beam, and
    ii. a nitrogen-vacancy (NV) diamond (130) disposed at a central point of the laser cavity network (120), configured to accept the one or more laser beams of the one or more laser cavity arms and measure the magnetic field in response to the plurality of laser beams;
      wherein measuring the magnetic field comprises optically measuring an electron spin state of a center of the NV diamond (130); and
  c. a power and control subsystem (200) communicatively connected to the laser cavity network (120) such that the power and control subsystem (200) is external to the housing (110).

13. The system (100) of claim 12, wherein the power and control subsystem (200) comprises a power supply configured to power the laser cavity network (120) and control electronics to control a function of the laser cavity network (120).

14. The system (100) of claim 12, wherein the one or more shock absorbers (115) comprise springs, foam, rubber, or a combination thereof.

15. The system (100) of claim 12, wherein, for each laser cavity arm of the one or more laser cavity arms, the means for locking the wavelength of the laser beam comprises a rough tuning filter (123) operatively coupled to the gain chip (122), configured to coarsely tune the laser beam generated by the gain chip (122).

16. The system (100) of claim 15, wherein the rough tuning filter (123) comprises a birefringent filter.

17. The system (100) of claim 12, wherein, for each laser cavity arm of the one or more laser cavity arms, the means for locking the wavelength of the laser beam comprises a temperature-controlled etalon (124) disposed optically in line with the gain chip (122), configured to fine-tune and narrow a linewidth of the laser beam.

18. The system (100) of claim 17, wherein the temperature-controlled etalon (124) comprises a thermoelectric cooler.

19. The system (100) of claim 12, wherein each laser cavity arm of the one or more laser cavity arms further comprises a mirror component (125) disposed optically in line with the gain chip (122).

20. The system (100) of claim 19, wherein, for each laser cavity arm of the one or more laser cavity arms, the means for locking the wavelength of the laser beam comprises a laser line stabilization component (126) operatively coupled to the mirror component (125), configured to adjust a position of the mirror component (125) to lock the wavelength of the laser beam to a desired wavelength.

* * * * *